United States Patent [19]

Iwahashi

[11] Patent Number: 4,742,565
[45] Date of Patent: May 3, 1988

[54] RADIO RECEIVER WITH FIELD INTENSITY DETECTOR

[75] Inventor: Koji Iwahashi, Tokyo, Japan

[73] Assignee: NEC Corporation, Japan

[21] Appl. No.: 29,367

[22] Filed: Mar. 23, 1987

Related U.S. Application Data

[63] Continuation-in-part of Ser. No. 632,593, Jul. 19, 1984, abandoned.

[30] Foreign Application Priority Data

Jul. 22, 1983 [JP] Japan ............................... 58-135012

[51] Int. Cl.$^4$ ............................................. H04B 1/16
[52] U.S. Cl. .................................... 455/234; 455/239; 455/250; 330/279
[58] Field of Search ............... 455/205, 210, 211, 234, 455/239, 240, 242, 243, 250, 341; 330/278–280

[56] References Cited

U.S. PATENT DOCUMENTS

| | | | |
|---|---|---|---|
| 3,167,713 | 1/1965 | Bastian | 4554/234 |
| 3,341,778 | 9/1967 | Dryden | 455/240 |
| 3,982,186 | 9/1976 | Furuno | 455/210 |
| 4,380,737 | 4/1983 | Sanders | 330/279 |
| 4,492,926 | 1/1985 | Kusakabe et al. | 330/280 |
| 4,528,519 | 7/1985 | Van Driest | 330/279 |

*Primary Examiner*—Michael A. Masinick
*Attorney, Agent, or Firm*—Laff, Whitesel, Conte & Saret

[57] ABSTRACT

A radio reciever having a plurality of intermediate frequency amplifiers and a field intensity detector. A control circuit is provided which generates a control signal for reducing the gains of the intermediate frequency amplifiers in response to an output of the field intensity detector and when a voltage associated with an input field intensity has risen beyond a predetermined level.

7 Claims, 5 Drawing Sheets

COMPARATOR SECTION WITH HYSTERESIS | INVERTING AMPLIFIER SECTION

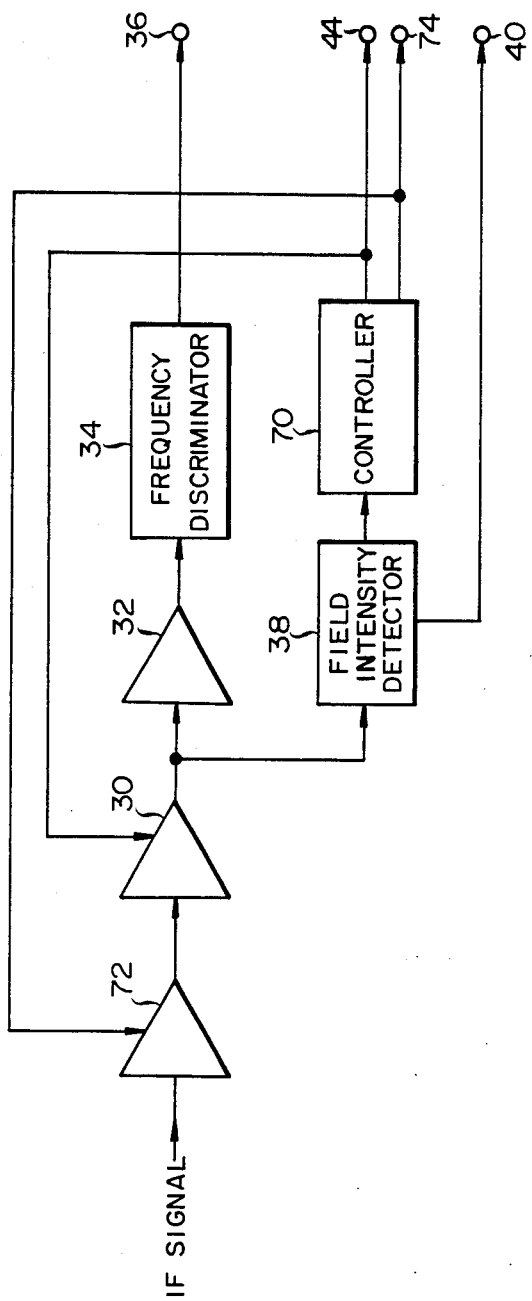
F I G. 7

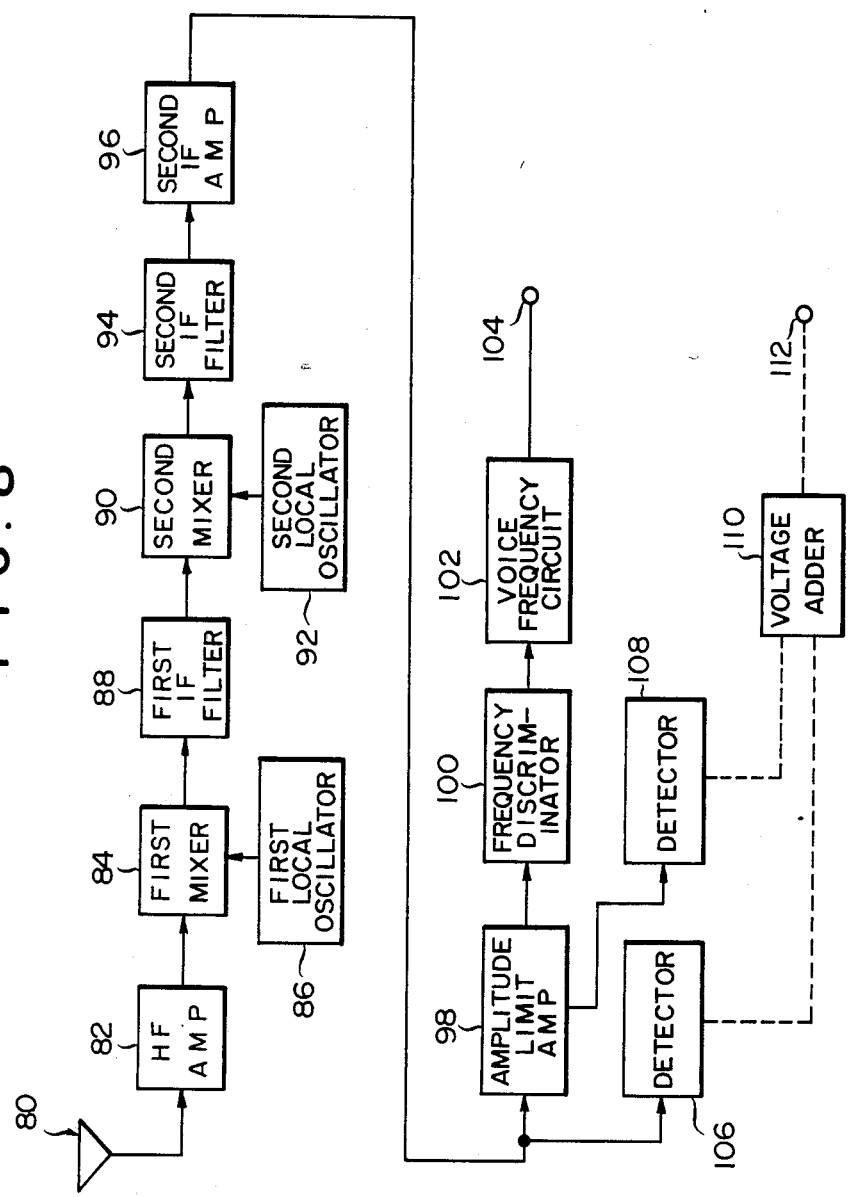

RADIO RECEIVER WITH FIELD INTENSITY DETECTOR

This application is a continuation-in-part of application Ser. No. 632,593, filed July 19, 1984, now abandoned.

BACKGROUND OF THE INVENTION

The present invention relates to a radio receiver of the type having a field intensity detector.

A prior art radio receiver of the type described includes two intermediate frequency (IF) amplifiers connected one after the other. The output of the succeeding IF amplifier is coupled to a frequency discriminator, while the output of the preceding IF amplifier is coupled to a field intensity detector via a junction between the two IF amplifiers. The field intensity detector in turn produces a dc voltage associated with an input field intensity. Of an input field intensity to output voltage relationship of the field intensity detector, a specific part wherein the sensitivity is desirable, i.e., the input field intensity and output voltage are linearly related, is used.

The field intensity detector mentioned above usually comprises a single transistor or diode and, hence, the available range of the linear part is quite narrow. It follows that where a power source voltage is relatively low, the sensitivity to input field intensity is also low limiting the range of the usable field intensities, i.e., dynamic range.

SUMMARY OF THE INVENTION

It is therefore, an object of the present invention to provide a radio receiver with a field intensity detector which conserves high sensitivity even when a power source voltage is low, operates over a wide dynamic range, and attains excellent linearity in input field intensity to output voltage characteristic.

It is another object of the present invention to provide a generally improved radio receiver with a field intensity detector.

A radio receiver having a field intensity detector of the present invention comprises at least one intermediate frequency amplifier having a variable gain and supplied with an input intermediate frequency signal, a frequency discriminator for demodulating an output of the intermediate frequency amplifier, a field intensity detector supplied with an output of the intermediate frequency amplifier to produce a dc voltage a level of which corresponds to the input level, terminals out of the radio receiver for providing the control signal and the output dc voltage of the field intensity detector, and a controller for producing a control signal when an output dc voltage of the field intensity detector means is raised above a predetermined level, the intermediate frequency amplifier being constructed to vary the gain thereof in response to the control signal, whereby a detectable range of input field intensities assigned to the field intensity detector means is increased.

In accordance with the present invention, a radio receiver having a plurality of intermediate frequency amplifiers and a field intensity detector is disclosed. A control circuit is provided which generates a control signal for reducing the gains of the intermediate frequency amplifiers in response to an output of the field intensity detector and when a voltage associated with an input field intensity has risen beyond a predetermined level.

The above and other objects, features and advantages of the present invention will become apparent from the following detailed description taken with the accompanying drawings.

BRIEF DESCRIPTION OF THE DRAWINGS

FIG. 7 is a block diagram showing a part of another embodiment of the present invention;

FIG. 8 is a block diagram showing an entire construction of a radio receiver to which the present invention is applicable.

DESCRIPTION OF THE PREFERRED EMBODIMENTS

While the radio receiver with a field intensity detector of the present invention is susceptible of numerous physical embodiments, depending upon the environment and requirements of use, substantial numbers of the herein shown and described embodiments have been made, tested and used, and all have performed in an eminently satisfactory manner.

Figure 1:
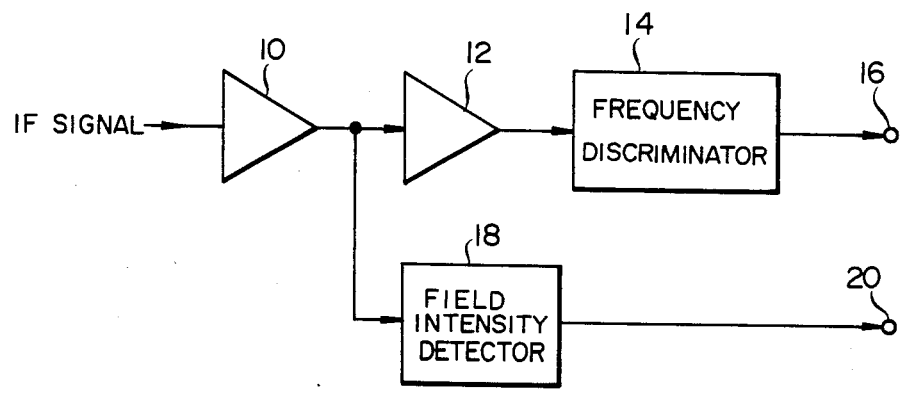
FIG. 1 is a block diagram showing a part of a prior art radio receiver which has a field intensity detector therewith.
Figure 2:
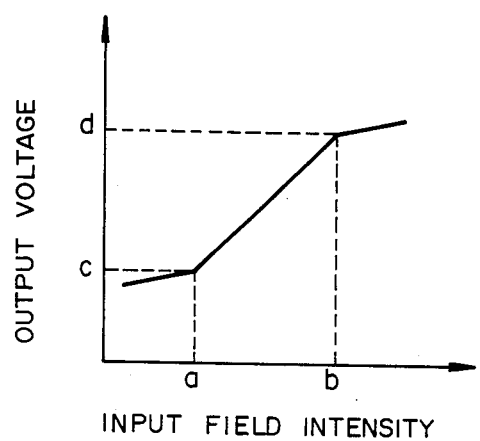
FIG. 2 shows a curve representative of a field intensity to output voltage characteristic particular to the field intensity detector of FIG. 1.

Before entering into detailed description of the present invention, a brief reference will be made to a prior art radio receiver having a field intensity detector, shown in FIG. 1. As shown, the radio receiver includes IF amplifiers 10 and 12 connected in two consecutive steps. The output of the succeeding IF amplifier 12 is connected to a frequency discriminator 14 the output of which is in turn connected to a terminal 16. The output of the preceding IF amplifier 10 is connected to a field intensity detector 18. The output of the field intensity detector 18 is a dc voltage which is associated with an input field intensity and is applied to a terminal 20. FIG. 2 shows a curve representative of an input field intensity to output voltage characteristic of the field intensity detector 18. In FIG. 2, voltages d and c are associated with field intensities a and b, respectively. Among the outputs of the field intensity detector 18, those which lie in the linear part a-b of the curve wherein the sensitivity is high are used.

Now, where the field intensity detector 18 comprises a single transistor or diode, it is impossible to design the linear part a-b of the input field intensities sufficiently wide. While the range of usable input field intensities, or dynamic range, may be increased by arranging the circuitry such that the gradient of the curve shown in FIG. 2 becomes smaller, such would lower the sensitivity of the field intensity detector. Further, when a power source voltage is low, both the dynamic range and the sensitivity are limited.

The problematic situation discussed above may be somewhat alleviated if the field intensity detector 18 is made up of multiple serially connected transistors or diodes and their dc voltages are combined. This implementation is not fully acceptable, however, since the attainable sensitivity is low when the power source voltage is low. In addition, due to the combined dc voltages, the input field intensity to output voltage characteristics loses linearity whereby the dependence of the sensitivity upon the field intensity as well as upon temperature and other ambient conditions is undesirably enhanced.

Figure 3:
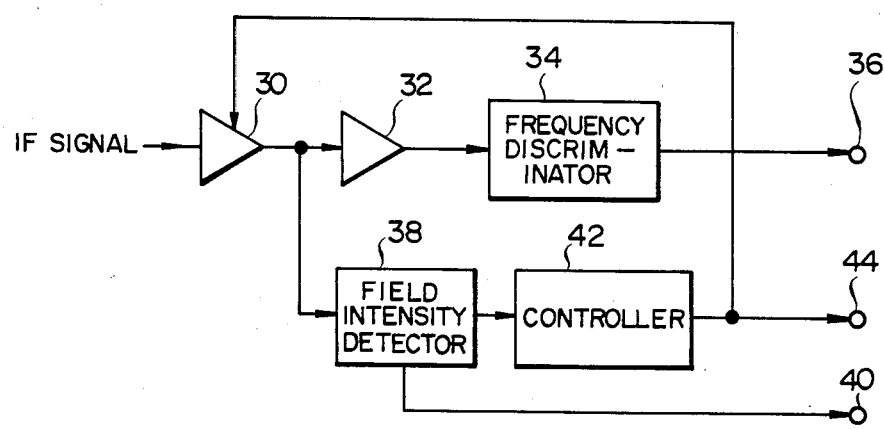
FIG. 3 is a block diagram showing a part of a radio receiver with a field intensity detector embodying the present invention.

Referring to FIG. 3, a radio receiver in accordance with the first embodiment of the present invention is shown. An IF signal sequentially passes through IF amplifiers 30 and 32 to be demodulated by a frequency discriminator 34. The output of the frequency discriminator 34 is applied to a terminal 36. The IF signal output from the IF amplifier 30 is also applied to a field intensity detector 38 an output of which, a dc voltage, is delivered to a terminal 40. At the same time, the dc output of the field intensity detector 38 is routed to a controller 42 an output of which is coupled to a terminal 44 while being fed back to the IF amplifier 30.

Figure 4:
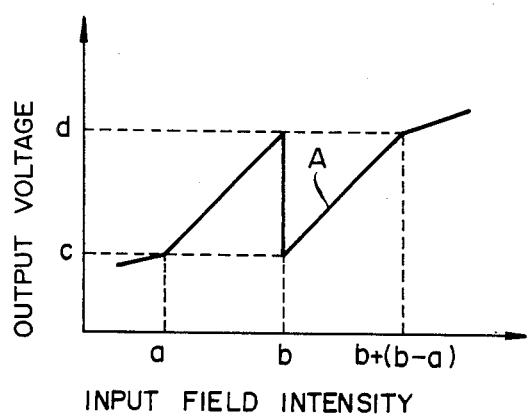
FIG. 4 is shows a curve representative of a field intensity to output voltage characteristic particular to the field intensity detector of FIG. 3.

FIG. 4 shows a curve representative of an input field intensity to output voltage characteristic of the field intensity detector 38. The maximum field intensity which the detector 38 can detect is b. When the input field intensity has risen above b, i.e., when output voltage has increased beyond d, the controller 42 applies to the IF amplifier 30 a signal for reducing its gain. The amount of the reduction of the gain is predetermined such that it lowers the field intensity by b−a. Hence, the dc voltage output from the field intensity detector 38 becomes equal to a level c when the input field intensity b has been exceeded. Thereafter, the detector 38 exhibits such a characteristic as indicated by a length of line A in FIG. 4 until the input field intensity reaches b+(b−a). This means an increase in the detectable maximum input field intensity up to b+(b−a).

Whether an input field intensity lies in the range a-b or in the range b-{b+(b−a)} is indicated by a control signal output from the controller 42; range a-b when the controller output is absent and range b-{b+(b−a)} when it is present.

Various methods are available for the control of the gain of the IF amplifier 30 as typified by varying the power source voltage, causing the power source voltage to bypass the amplifier, and turning off the amplifier to utilize a fragment which squeezed therethrough. The amount of change of the gain is readily adjustable.

Figure 5:
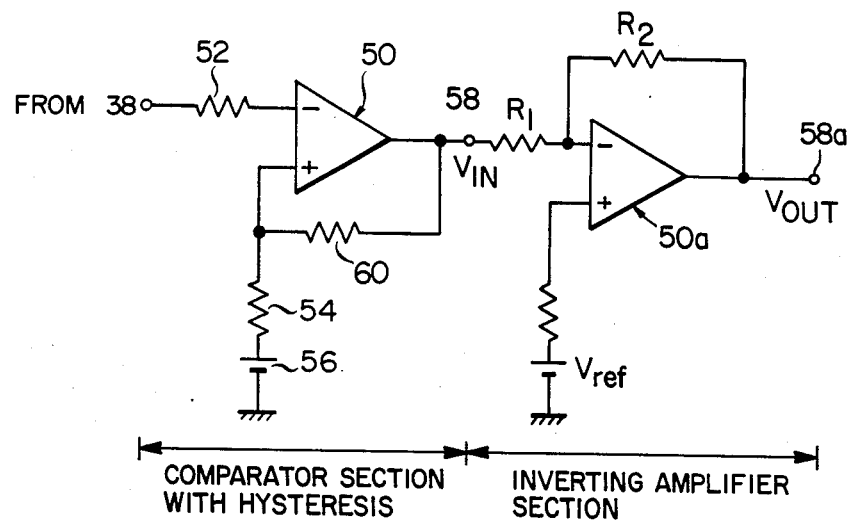
FIG. 5 is a diagrammatic showing of a control circuit included in the radio receiver of the present invention.
Figure 6:
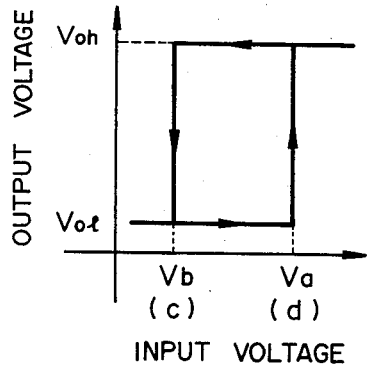
FIG. 6 shows waveforms appearing at an output terminal of the circuit shown in FIG. 5.

The controller 42 employs a digital processing system for delivering control signals and processing detected voltages, and such a system can be implemented with ease. For example, it may be implemented by a comparator having a hysteresis characteristic. That is, as shown in FIG. 5, a comparator 50 has a non-inverting input connecting to a resistor 52 to be supplied therethrough with an output voltage of the field intensity detector 38. The comparator 50 also has an inverting input connecting to a series connection of a resistor 54 and a power source 56, which is adapted to generate a reference voltage. The output of the comparator 50 is fed to a terminal 58 and, via a resistor 60, fed back to the inverting input. By suitably selecting the resistance of the resistors 52, 54 and 60 and the reference voltage output from the power source 56, there appear at the output terminal 58a voltages having waveforms with hysteresis as shown in FIG. 6. An inverting amplifier 50a, has a coupling resistor $R_1$, a feedback resistor $R_2$, and a bias resistor $V_{ref}$. The amplifier 50a inverts the signals from amplifier 50, which appear at terminal 58 and thereby produces the hysteresis of FIG. 6. Without the inverting amplifier 50a, and its associated resistors, the hysteresis appearing at terminal 58 would be the same as that shown in FIG. 6, except that the arrows would point in opposite directions. In FIG. 6, designated by $V_{0h}$ and $V_{0l}$ are respectively a high level voltage and a low level voltage each appearing at the output terminal 58a of FIG. 5.

Now, let $R_{54}$ be the resistance of the resistor 54 and $R_{60}$, that of the resistor 60. Then, there holds an equation:

$$V_a - V_b = R_{54} / (R_{54} + R_{60}) \times (V_{0h} - V_{0l})$$

By choosing the voltage d shown in FIG. 4 as the input voltage $V_a$ and the voltage c as the input voltage $V_b$, the voltage appearing at the output terminal 58 shown in FIG. 5 is varied in the following manner. When the field intensity in FIG. 4 has increased beyond the level b, i.e., when the output voltage has risen beyond the level d, the voltage $V_{0h}$ appears at the output terminal 58 of FIG. 5. A signal having this voltage $V_{0h}$ is the signal adapted to control the IF amplifier 30 to reduce the amplification degree. Upon decrease of the input field intensity to below the level b, i.e., upon decrease of the output voltage to below the level c, the voltage $V_{0h}$ turns into the voltage $V_{0l}$ which restores the original amplification degree of the IF amplifier 30. Stated another way, the voltage $V_{0l}$ serves as a control signal showing that the field intensity is lower than b, and the voltage $V_{0h}$ as a control signal showing that the field intensity is higher than b.

It will be understood from FIG. 4 that the input field intensity to output voltage characteristic attainable with the embodiment described above preserves desirable linearity and sensitivity despite the increase in the linear part from a-b to a-}b+(b−a)}.

Referring to FIG. 7, there is shown another embodiment of the present invention in a block diagram. In FIG. 7, the same or similar structural elements as those shown in FIG. 3 are designated by like reference numerals. The alternative embodiment of FIG. 7 includes IF amplifiers which are interconnected in two consecutive steps and controlled by a common control circuit. That is, an IF signal sequentially passes through interconnected IF amplifiers 72 and 30 each having its amplification degree controlled by a controller 70. The output of the IF amplifier 30 is routed through another IF amplifier 32 to the frequency discriminator 34 to be thereby demodulated. Meanwhile, the output of the IF amplifier 30 is detected by the field intensity detector 38. The controller 70 develops a control signal upon rise of the detected voltage beyond a predetermined level. The reference numeral 74 in FIG. 7 designates a control output terminal. In this manner, the embodiment of FIG. 7 has two consecutive IF amplifiers 72 and 30 with controllable gains and, therefore, achieves a range of detectable input field intensities wider than the embodiment of FIG. 3 by a proportion equal to one step. Needless to mention, the number of IF amplifiers with controllable gains may be further increased to proportionally increase the range of the detectable input field intensities. In that case, too, the linearity or the sensitivity would be prevented from being deteriorated.

Hereinafter will be described an entire construction of a radio receiver to which the present invention is applicable.

Referring to FIG. 8, a standard, double-super heterodyne system generally used as a frequency modulation (FM) or phase modulation (PM) receiver is shown in a block diagram. A radio frequency (RF) signal coming in through an antenna 80 is amplified by a high frequency amplifier 82 and, then, applied to a first mixer 84. In the first mixer 84, the received frequency is converted to a first intermediate frequency by a frequency generated by a first local oscillator 86. The output of the mixer 84 is coupled to a first IF filter 88 which then removes the image frequency spurious of a second intermediate frequency from the input. The output of the filter 88 is applied to a second mixer 90 with which a second local oscillator 92 is associated, so that the first intermediate frequency is converted to a second intermediate frequency. Thereafter, the second intermediate frequency signal is passed through a second or band limiting IF filter 94 and, then, applied to a second IF amplifier 96. The output of this amplifier 96 is further amplified by an amplitude limiting amplifier 98. Here, even if a received input is absent amplification is effected until saturation by receiver noise is set up. The output of the amplifier 98 is demodulated into a voice frequency signal by a frequency discriminator 100 the output of which is applied to a voice frequency circuit 102, which is adapted to amplify and limit the band of the voice frequency signal. The output of the voice frequency circuit 102, now having a predetermined voice level, is delivered to a terminal 104.

Figure 9:
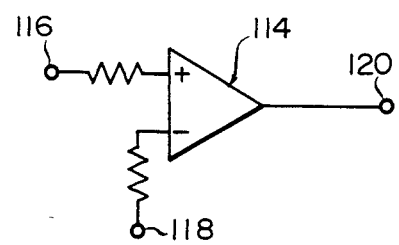
FIG. 9 is a circuit which may use a field level voltage developed in the radio receiver of FIG. 8.

Apart from the path for a demodulated signal described above, an ordinary receiver has a branch path which extends from an input of the second IF amplifier 98 or from within the amplifier 98 to terminate at a detector 106 or 108. In this construction, the second If signal picked up at the input of or from within the amplifier 98 is converted to a dc voltage level by the detector 106 or 108. The dc voltage may be applied to a terminal 112 after being subjected to dc mixing by a voltage adder 110. As shown in FIG. 9, the field level voltage is applied to an input terminal 116 of a comparator 114 to be thereby compared with a reference voltage, which is applied to a terminal 118. Based on the result of the comparison, the comparator 114 produces an on-off signal at its terminal 120 which may be used as a squelch signal for a receiver, a power control signal for a transmit power amplifier, a circuit make/break signal for a radio apparatus, etc. It will be noted that the "squelch signal" is a signal for operating a squelch circuit which serves to cut off an audio output when the received input signal is weak, the "power control signal for a transmit power amplifier" is a signal for controlling transmission power when a received field intensity is high, i.e., where a base station is located near the receiver, and the "circuit make/break signal for a radio apparatus" is a signal for deciding whether or not to break the circuit in order to conserve communications quality in a radio apparatus, i.e., a signal for running a make operation flow when the received field intensity is higher than a certain value and a break operation flow when otherwise.

In summary, it will be seen that the present invention provides a radio receiver having a field intensity detector which detects an input field intensity with high sensitivity and provides excellent linearity in field intensity to output voltage characteristic, with no regard to a power source voltage.

Various modifications will become possible for those skilled in the art after receiving the teachings of the present disclosure without departing from the scope thereof.

What is claimed is:

1. A radio receiver having a field intensity detector, comprising:

at least one intermediate frequency amplifier means having a gain that is incrementally variable in predetermined step amounts and is supplied with an intermediate frequency input signal;

frequency discriminator means for demodulating an output of said intermediate frequency amplifier means;

field intensity detector means supplied with an output of the intermediate frequency amplifier means for producing a dc voltage, said dc voltage having a level corresponding to the input level;

control means responsive to the output signal levels of said detector means for producing a "0" or "1" control signal depending upon whether the level of said output dc voltage of the field intensity detector does or does not raise above a predetermined level;

output terminal means on the radio receiver for providing the control signal and the output dc voltage of the field intensity detector means; and means responsive to said control signal for selectively changing the gain of the intermediate frequency amplifier means by a selected step amount in order to vary the gain thereof in a step-wise manner in response to said control signal;

said control means comprising a comparator responsive to the field intensity detector means detecting a range of input field intensities for producing an output with a hysteresis characteristic having a dynamic range corresponding to said detected range;

said intermediate frequency amplifier means being constructed to decrease or increase the gain which corresponds to an amount of a range of input field intensities which are detectable by the field intensity detector means.

2. A radio receiver having a field intensity detector, comprising:

at least one intermediate frequency amplifier means having a gain that is incrementally variable in predetermined step amounts and is supplied with an input intermediate frequency signal;

frequency discriminator means for demodulating an output of said intermediate frequency amplifier means;

field intensity detector means responsive to an output of the intermediate frequency amplifier means for producing a dc voltage having a level corresponding to the input level;

control means responsive to said output signal levels of said field intensity detector means for producing a "0" or "1" control signal depending upon whether the level of the output dc voltage of the field intensity detector means does or does not raise above a predetermined level;

output terminal means on the radio receiver for providing the control signal and the output dc voltage of the field intensity detector means; and means for changing the gain of the intermediate frequency amplifier means by a selected step amount responsive to said control signal in order to vary the gain thereof in a step-wise manner in response to said control signal.

3. The radio receiver as claimed in claim 2, in which said predetermined level correponds to a maximum input level which is detected by the field intensity detector means when the intermediate frequency amplifier means is not controlled.

4. The radio receiver as claimed in claim 2, in which the control means comprises a comparator responsive to the field intensity detector means for producing an output with a hysteresis characteristic having a dynamic range corresponding to a range of input field intensities detected by said field intensity detector means.

5. The radio receiver as claimed in claim 2, in which said predetermined level corresponds to a maximum input level which is detected by the field intensity detector means when the intermediate frequency amplifier means is not controlled by the control means and to an amount of a detectable range of input field intensities encountered by the field intensity detector means.

6. The radio receiver as claimed in claim 5, in which said detectable range of input field intensities is proportionally increased as the number of the intermediate frequency amplifier means is increased.

7. The radio receiver as claimed in claim 2, in which said intermediate frequency amplifier means decrease or increase the gain by an amount which corresponds to a range of input field intensities which are detectable by the field intensity detector means.

* * * * *